US009402312B2

(12) United States Patent
Shen et al.

(10) Patent No.: US 9,402,312 B2
(45) Date of Patent: Jul. 26, 2016

(54) CIRCUIT ASSEMBLIES WITH MULTIPLE INTERPOSER SUBSTRATES, AND METHODS OF FABRICATION

(71) Applicant: Invensas Corporation, San Jose, CA (US)

(72) Inventors: Hong Shen, Oak Park, CA (US); Zhuowen Sun, Campbell, CA (US); Charles G. Woychik, San Jose, CA (US); Arkalgud Sitaram, Cupertino, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 14/275,741

(22) Filed: May 12, 2014

(65) Prior Publication Data

US 2015/0327367 A1   Nov. 12, 2015

(51) Int. Cl.
*H01L 25/065* (2006.01)
*H01L 23/538* (2006.01)
*H01L 23/498* (2006.01)
(Continued)

(52) U.S. Cl.
CPC .............. *H05K 1/111* (2013.01); *H01L 23/498* (2013.01); *H01L 23/538* (2013.01); *H01L 23/5383* (2013.01); *H01L 23/5385* (2013.01); *H01L 23/5389* (2013.01); *H01L 25/0652* (2013.01); *H01L 25/0655* (2013.01); *H01L 25/50* (2013.01); *H05K 1/0271* (2013.01); *H05K 1/141* (2013.01); *H05K 1/181* (2013.01); *H01L 2224/16225* (2013.01);
(Continued)

(58) Field of Classification Search
CPC ............ H01L 25/0655; H01L 25/0652; H01L 23/538; H01L 23/5383; H01L 23/5389; H01L 23/498; H01L 23/49822
See application file for complete search history.

(56) References Cited

U.S. PATENT DOCUMENTS

| 4,467,342 A | 8/1984 | Tower |
| 5,399,898 A | 3/1995 | Rostoker |

(Continued)

FOREIGN PATENT DOCUMENTS

| EP | 0 065 425 A2 | 11/1982 |
| JP | H11-135675 | 5/1999 |

(Continued)

OTHER PUBLICATIONS

U.S. Appl. No. 14/214,365 titled, "Integrated Circuits Protected by Substrates with Cavities, and Methods of Manufacture," filed Mar. 14, 2014, 40 pages.

(Continued)

*Primary Examiner* — Phat X Cao
(74) *Attorney, Agent, or Firm* — Haynes and Boone, LLP

(57) ABSTRACT

A combined interposer (120) includes multiple constituent interposers (120.*i*), each with its own substrate (120.*i*S) and with a circuit layer (e.g. redistribution layer) on top and/or bottom of the substrate. The top circuit layers can be part of a common circuit layer (120R.T) which can interconnect different interposers. Likewise, the bottom circuit layers can be part of a common circuit layer (120R.B). The constituent interposer substrates (120.*i*S) are initially part of a common wafer, and the common top circuit layer is fabricated before separation of the constituent interposer substrates from the wafer. Use of separated substrates reduces stress compared to use of a single large substrate. Other features are also provided.

16 Claims, 11 Drawing Sheets

(51) Int. Cl.
  *H05K 1/11* (2006.01)
  *H01L 25/00* (2006.01)
  *H05K 1/18* (2006.01)
  *H05K 1/02* (2006.01)
  *H05K 1/14* (2006.01)

(52) U.S. Cl.
  CPC ............ *H01L 2924/15192* (2013.01); *H01L 2924/15311* (2013.01); *H01L 2924/181* (2013.01)

(56) References Cited

U.S. PATENT DOCUMENTS

| | | |
|---|---|---|
| 6,322,903 B1 | 11/2001 | Siniaguine et al. |
| 6,958,285 B2 | 10/2005 | Siniaguine |
| 7,098,542 B1 | 8/2006 | Hoang et al. |
| 8,237,289 B2 | 8/2012 | Urakawa |
| 8,618,659 B2 | 12/2013 | Sato et al. |
| 8,704,364 B2 | 4/2014 | Banijamali |
| 8,704,384 B2 | 4/2014 | Wu et al. |
| 2002/0038909 A1 | 4/2002 | Sugizaki |
| 2004/0195682 A1 | 10/2004 | Kimura |
| 2009/0267238 A1 | 10/2009 | Joseph et al. |
| 2012/0020027 A1 | 1/2012 | Dungan et al. |
| 2012/0168916 A1 | 7/2012 | Chi et al. |
| 2012/0228778 A1 | 9/2012 | Kosenko et al. |
| 2013/0161836 A1 | 6/2013 | Yeom et al. |
| 2013/0200511 A1 | 8/2013 | Banijamali |
| 2013/0214432 A1 | 8/2013 | Wu et al. |
| 2013/0307143 A1* | 11/2013 | Lin et al. .................. 257/737 |
| 2014/0042643 A1* | 2/2014 | Yu et al. .................. 257/777 |
| 2014/0070380 A1 | 3/2014 | Chiu et al. |
| 2014/0084415 A1 | 3/2014 | Lin et al. |
| 2014/0124957 A1* | 5/2014 | Iwase et al. .................. 257/777 |

FOREIGN PATENT DOCUMENTS

| | | |
|---|---|---|
| WO | 02/34019 A1 | 4/2002 |
| WO | WO 2013/119309 A1 | 8/2013 |

OTHER PUBLICATIONS

International Search Report issued by the European Patent Office Search Authority for Int'l Patent Application No. PCT/US2015/030416 (Aug. 27, 2015) pp. 1-3.

Written Opinion of the International Searching Authority by the European Patent Office for Int'l Patent Application No. PCT/US2015/030416 (Aug. 27, 2015) pp. 1-8.

Patent Abstracts of Japan for H11-135675, 2002.

* cited by examiner

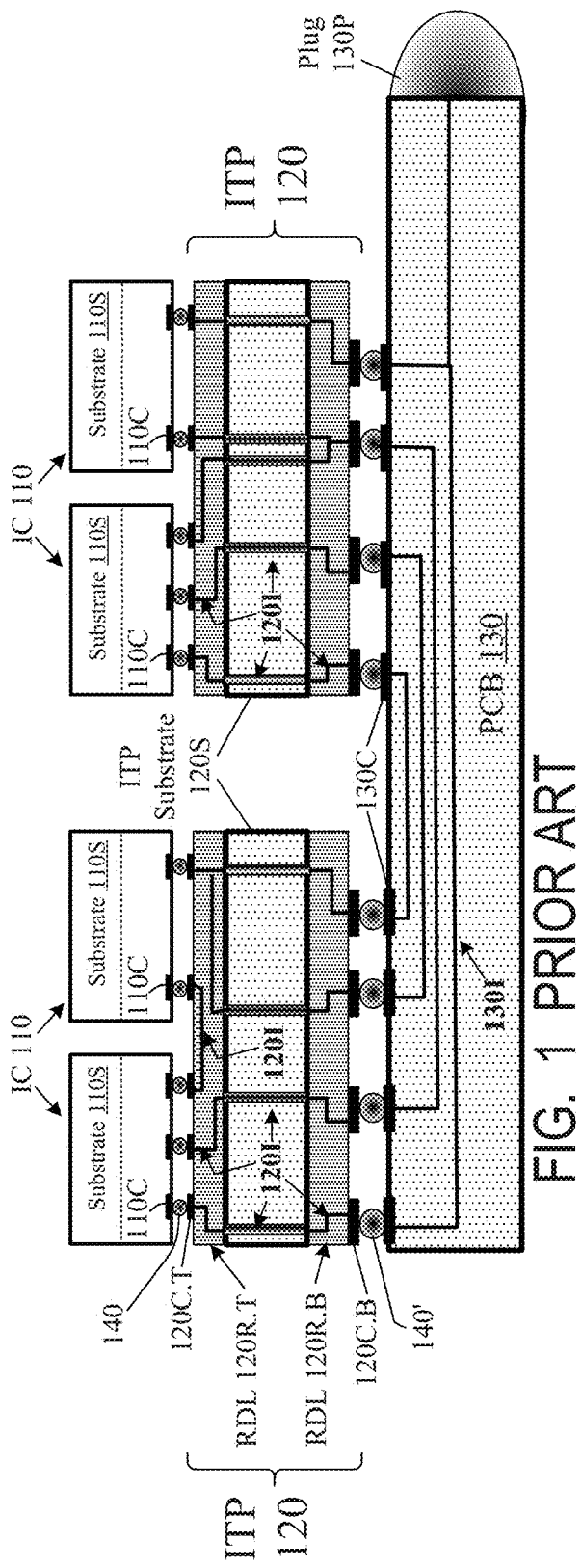
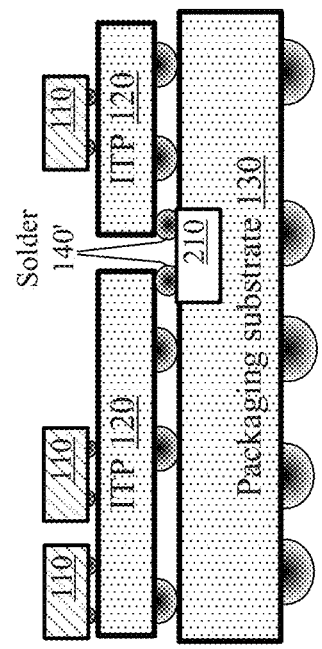
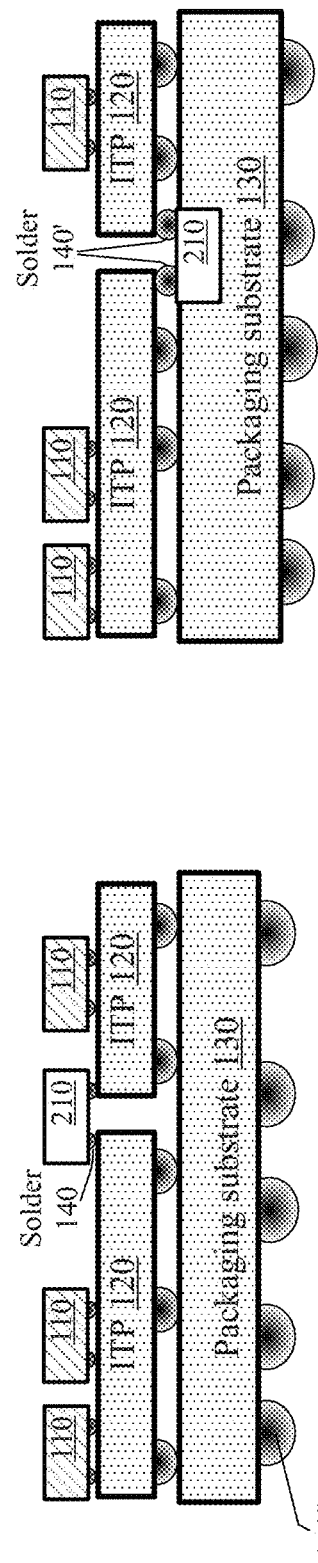
FIG. 1 PRIOR ART
FIG. 2A PRIOR ART
FIG. 2B PRIOR ART

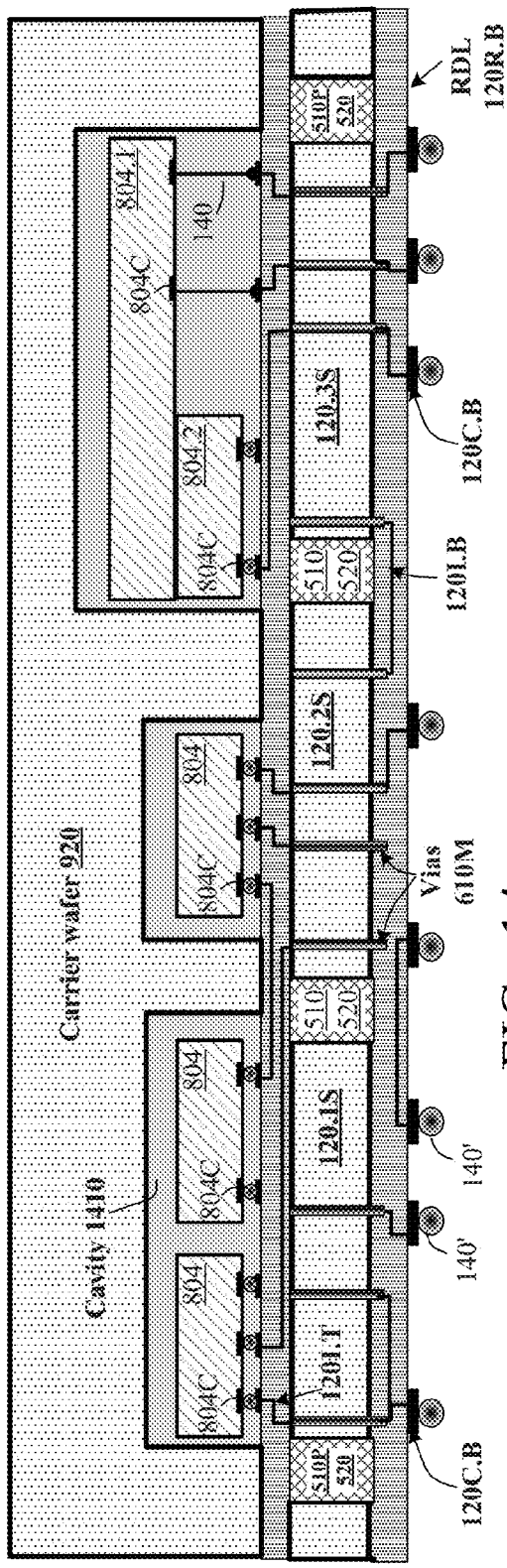
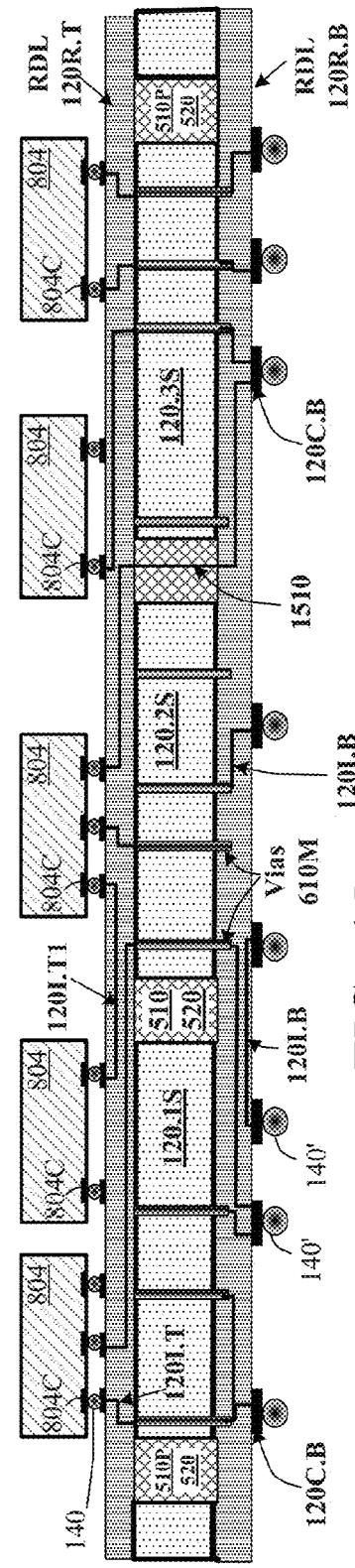
FIG. 14
FIG. 15

CIRCUIT ASSEMBLIES WITH MULTIPLE INTERPOSER SUBSTRATES, AND METHODS OF FABRICATION

BACKGROUND OF THE INVENTION

This document relates to circuit assemblies that include integrated circuits (ICs) and interposers.

A typical IC is a small, fragile device with tiny contact pads that cannot be directly connected to large electro-mechanical connectors such as screw connectors or computer-card slots. Therefore, ICs are packaged into sturdier packages having larger contact pads. The packages should preferably be small and allow circuits to be interconnected by short electrical paths to provide high speed and low power consumption. To achieve these objectives, a single package may interconnect multiple circuits. For example, a package may include a number of ICs and discrete circuits attached to a printed circuit board (PCB) to form a sturdy computer card that can be forced into a tight computer-card slot without breakage. The PCB includes interconnect lines that interconnect multiple ICs or other circuits and connect them to a sturdy plug insertable into the slot.

A PCB can be inexpensively manufactured as a laminate of conductive (copper) and insulating layers. While inexpensive, this manufacturing technology does not allow the interconnects and contact pads to have a high density provided by technologies used to manufacture ICs. Therefore, some packages include intermediate substrates between the ICs and the PCBs. An intermediate substrate, called "interposer", can be formed of silicon or other material to provide denser interconnects. An interposer may also have denser contact pads for attachment to the ICs, and may have larger, farther-spaced contact pads for attachment to the PCB or other interposers. In addition to facilitating IC interconnection, an interposer may absorb some of the thermal expansion stresses resulting from differences in the coefficients of thermal expansion (CTE) between the ICs, the PCB, and other parts of a circuit assembly. (Thermal stresses are a common cause of IC package failure.)

FIG. 1 shows an example package with ICs 110 interconnected by two interposers ("ITP") 120 and a PCB 130. Each IC 110 may include transistors, resistors, capacitors and/or other circuit elements (not shown) formed in and around a corresponding semiconductor substrate 1105. The ICs can be accessed through their contact pads 110C, which are attached, by solder balls 140, to contact pads 120C.T at the top of interposers 120. Each interposer 120 also includes bottom contact pads 120C.B attached to PCB contact pads 130C by larger solder balls 140'. Each interposer 120 includes interconnect lines 120I ("interconnects") which provide suitable interconnection between the contact pads 120C.T and 120C.B. Each interposer includes a substrate 120S made of silicon or other material as suitable to absorb thermal stresses and provide desired density of interconnects 120I and top contact pads 120C.T; the bottom contact pads 120C.B are sufficiently large, and are sufficiently far apart, to match the PCB contact pads 130C. At least some of interconnects 120I can be part of redistribution layers (RDLs) 120R.T and 120R.B formed respectively at the top and bottom of the interposer (the redistribution layers include conductive and dielectric layers; the conductive layers provide the contact pads 120C.T and 120C.B). The PCB's interconnects 130I provide interconnection between the PCB contact pads 130C and, for example, a plug 130P connectable to external circuits. An encapsulant (not shown), can be flown over the structure and between the dies, the interposer, and the PCB, and then solidified, to increase the mechanical strength of the assembly and protect it from moisture, alpha particles, and other harmful elements.

As illustrated in FIG. 1, in addition to providing an interface between small IC contact pads 110C and large PCB contact pads 130C, interconnects 120I can also interconnect IC contact pads 110C of the same or different ICs, thus providing an additional interconnect level supplementing the PCB interconnects 130I. Interconnects 120I thus reduce the interconnect load on the PCB and also reduce the lateral size of the package and allow shorter electrical paths between the ICs 110. These advantages could be enhanced if the interposers 120 were merged into a single, larger interposer. However, use of large interposers leads to large stresses on connections 140 and 140'. Therefore, it is desirable to provide more efficient interconnection between different smaller interposers.

One solution to this problem is to use a bridging die 210 (FIGS. 2A, 2B) as described in U.S. pre-grant patent publication 2009/0267238 (Oct. 29, 2009; Joseph et al.). In FIG. 2A, two interposers 120 are attached to the top surface of an intermediate substrate 130 (a ceramic or organic substrate) which has solder balls 140" on the bottom for attachment to other devices. Dies 110, or stacks of such dies, are each attached to a single one of the interposers. Bridging die 210 overlies, and is attached to, both interposers 120 by solder balls 140 to provide fast and dense interconnects between the interposers.

In FIG. 2B, bridging die 210 underlies the interposers and is glued to the ceramic or organic substrate 130. Die 210 is attached to the interposers by solder balls 140'. See also PCT publication WO 2013/119309 (15 Aug. 2013) and U.S. pre-grant patent publications 2013/0200511 (Aug. 8, 2013, Banijamali) and 2013/0214432 (Aug. 22, 2013; Wu et al.).

If the interposers 120 are thin and fragile, they can be easily damaged during fabrication, and further it is difficult to keep them flat because they easily warp. According to the aforementioned publication US 2009/0267238 by Joseph et al., dies 110 are attached to their respective individual interposers 120, and then the interposers are separately attached to substrate 130. Attaching dies to the interposers is difficult if the interposers are warped and fragile as noted above.

A different fabrication process is described in the aforementioned PCT publication WO 2013/119309 and illustrated in FIG. 3. In that process, before the ICs are attached to the interposers, the interposers are "placed into or otherwise placed in contact with a molding or packaging material" 310. Material 310 extends into a gap 320 between the interposers and appears to hold the interposers together, facilitating the attachment of dies (not shown) to the interposer.

Other circuit assemblies and fabrication methods are desirable to facilitate fabrication and to shorten the interconnects.

SUMMARY

This section summarizes some of the exemplary implementations of this invention.

In some embodiments, an additional interconnect level is provided by a common RDL extending across multiple interposers. See FIG. 4 for example, showing a structure similar to FIG. 2A but with a common RDL 120R.T replacing the bridging die 210. The common RDL provides short, fast interconnects that can replace or supplement bridging dies. RDL fabrication can be cheaper than fabrication and attachment of bridging dies to interposers, but bridging dies can also be used if desired.

In some embodiments, multiple interposers are manufactured from a single wafer with a common RDL. Then the wafer is processed to separate the interposer substrates from each other, but the RDL is not separated into multiple RDLs.

Further, in some embodiments, at least some ICs are attached to the wafer (e.g. to the common RDL) before separation of the interposer substrates. Therefore, the interposer structure is stronger and able to dissipate more heat during IC attachment; also, there is no need to horizontally align interposer substrates with each other. Further, in some embodiments, the wafer is initially thick, and is thinned only after IC attachment. The high wafer thickness during the attachment further improves the strength and heat dissipation properties for the attachment process.

The invention is not limited to the features and advantages described above except as defined by the appended claims. In particular, the invention is not limited to any particular fabrication methods for the novel structures.

BRIEF DESCRIPTION OF THE DRAWINGS

FIGS. 1, 2A, 2B, 3 illustrate vertical cross sections of prior art IC packages.

FIGS. 8, 9, 10, 11, 12, 13, 14, 15, 16, 17 illustrate vertical cross sections of integrated circuit packages according to some embodiments of the present invention.

DESCRIPTION OF SOME EMBODIMENTS

The embodiments described in this section illustrate but do not limit the invention. The invention is defined by the appended claims.

Figure 4:
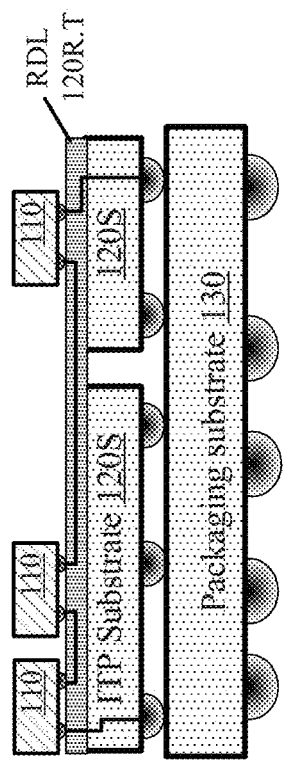
FIG. 4 illustrates a vertical cross section of an IC package according to some embodiments of the present invention.
Figure 3:
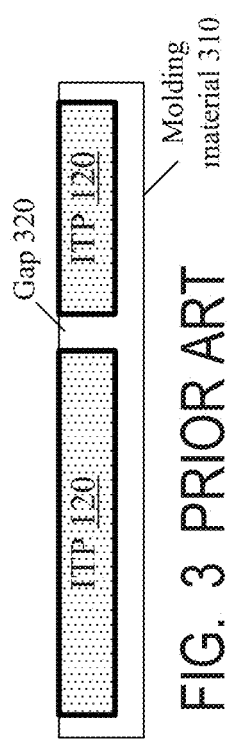
Figure 5A:
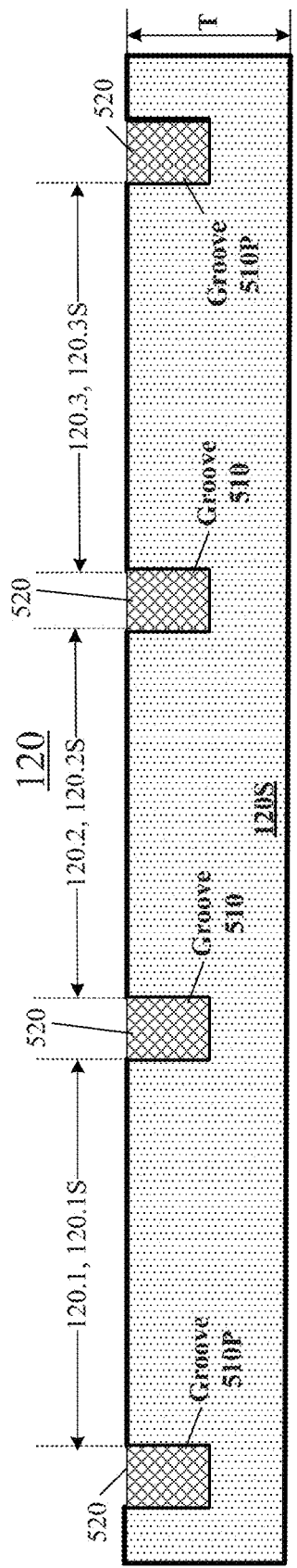
FIG. 5A illustrates a vertical cross section of an interposer structure in the process of fabrication according to some embodiments of the present invention.
Figure 5B:
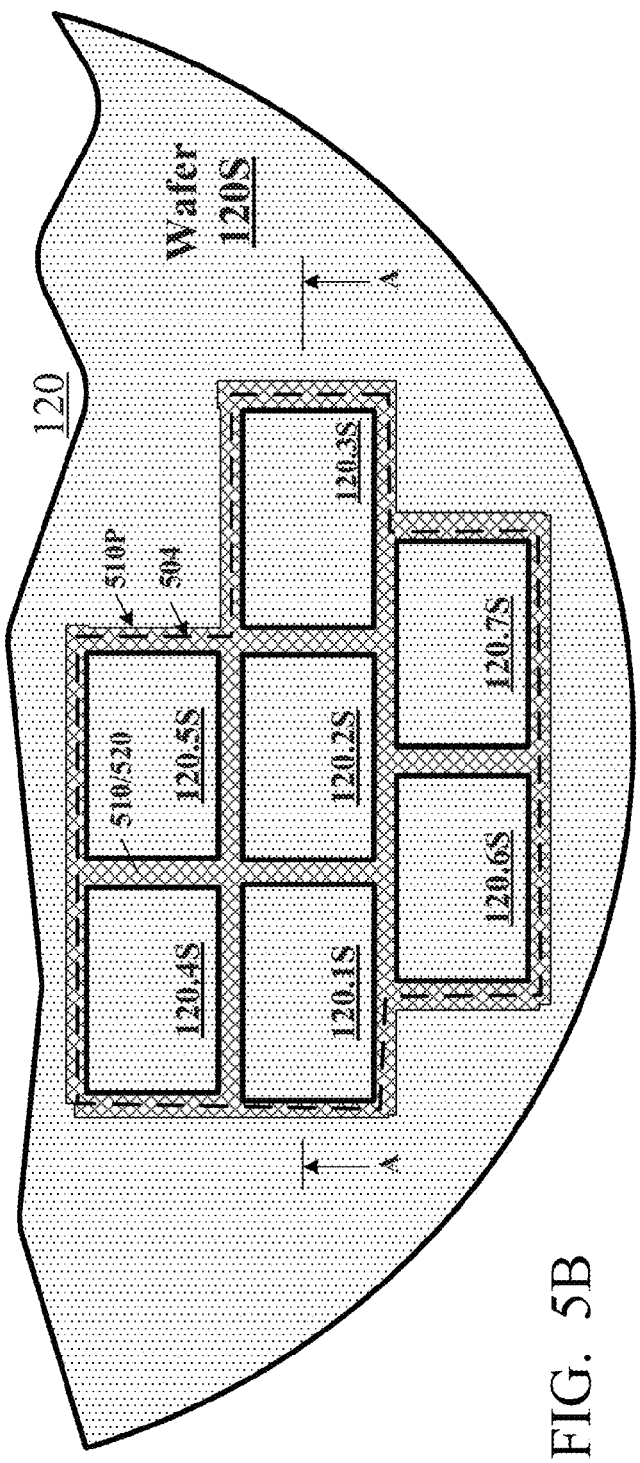
FIG. 5B illustrates a top view of an interposer structure in the process of fabrication according to some embodiments of the present invention.

FIGS. 5A, 5B illustrate beginning stages of interposer fabrication according to some embodiments of the present invention. FIG. 5A shows a vertical cross section marked A-A in the top view of FIG. 5B; FIG. 5B is on a smaller scale than FIG. 5A. A number of interposers will be manufactured based on a common substrate 120S. In FIG. 5B, the interposer substrate 120S is shown as part of a round wafer (could be a silicon wafer for example), but substrate 120S could be of any desired shape and material; exemplary materials include semiconductor materials, metals and other conductors, and dielectrics (organic or inorganic).

In the example shown, substrate 120S will yield a combined interposer 120 containing seven constituent interposers 120.1, . . . 120.7 whose substrates are shown at 120.1S through 120.7S respectively. Each substrate 120.$i$S (i=, 1, . . . , 7) will be a portion of substrate 120S. The perimeter of combined interposer 120 is shown by dashed line 504. Only one combined interposer 120 is shown, but substrate 120S may be used to form many combined interposers; each combined interposer may have any number of constituent interposers. The combined interposer and individual interposers can be of any shape and dimensions.

Substrate 120S will be thinned as described below. The substrate's initial thickness T (FIG. 5A) is larger than the final thickness. For example, if substrate 120S is a conventional silicon wafer, then its initial thickness can be 650 microns or greater, but this example is not limiting.

Grooves 510 are formed in the top surface of substrate 120S to partially separate individual substrates 120.1S through 120.7S. The grooves can be formed by any suitable process consistent with the interposer material, e.g. masked chemical etching, laser ablation, mechanical scribing or sawing. These examples are not limiting. (Grooves 510 may or may not form a continuous groove pattern as in FIG. 5B.)

The groove depth is less than T, and is about the same as the final thickness of substrate 120S; in some embodiments, the groove depth can be greater or smaller than the final thickness of substrate 120S. Just for illustration, if the initial thickness T of substrate 120S is over 600 microns, the final thickness can be 50 microns or less, and the groove depth can be 1 to 5 microns greater than the final thickness.

At the interposer perimeter 504, grooves 510 are shown as 510P. In some embodiments, the perimeter grooves 510P are omitted, i.e. the grooves are provided only between constituent interposers' substrates 120.$i$S.

Optionally, grooves 510 are filled with a filler 520, e.g. metal, dielectric (such as polyimide or silicon dioxide or some other dielectric) or some other material. In some embodiments, filler 520 improves CTE matching between the substrate 120S and other parts of the package, e.g. a PCB 130 (if PCB will be used), or other interposers or ICs that will be attached to interposer 120S, or an encapsulant (e.g. 910 in FIG. 9). For example, if substrate 120S has a lower CTE than such other parts of the package, the filler 520 can be chosen to have a higher CTE. Suppose for example that substrate 120S is monocrystalline silicon, having a CTE of about 2.6 ppm/° C., and the encapsulant and/or the PCB have a higher CTE, e.g. over 20 even over 30 or 40 ppm/° C. Then filler 520 can be a Benzocyclobutene-(BCB) based polymer, e.g. Cyclotene (Trademark) available from Dow Chemical Co. Cyclotene may have a CTE of 42 ppm/° C. The effective CTE of the combined system of substrate 120S and filler 520 (33 ppm/° C. or higher in some embodiments) becomes better matched with the PCB and/or the encapsulant, allowing the package to expand laterally without much vertical bending (i.e. without much warpage).

In some embodiments, filler 520 has a low elasticity modulus (at least in the lateral direction and possibly in all directions), e.g. lower than substrate 120S, to allow the substrate to laterally expand. Filler 520 may have any CTE in such embodiments. For example, in some embodiments, filler 520 comprises a porous material, e.g. foam; the porosity can be 5% by volume or greater.

In some embodiments, filler 520 has a low stiffness (defined as F/δ, which is a force acting on a material divided by the displacement produced by the force along the same degree of freedom, i.e. the direction in which the force acts). In some embodiments, the stiffness of filler 520 in all the grooves 510 is lower than the stiffness of each substrate 120.$i$S in the final interposer structure. The low stiffness may or may not be combined with any or both of the other properties described above, i.e. CTE matching and low elasticity modulus.

In some embodiments, filler 520 adheres well to substrate 120S to remain in place when constituent interposers' substrates 120.$i$S become separated from each other. An adhesion layer can be used to improve adhesion. In some embodiments, filler 520 has a high thermal conductivity, possibly higher than substrate 120S, to help dissipate heat during fabrication and/or in operation of the circuit assembly.

Filler 520 can be formed by any suitable process, e.g. chemical vapor deposition (CVD), physical vapor deposition (PVD), a spin-on process (if the filler 520 can be formed from a flowable material such as polyimide), or other processes. In FIG. 5A, the filler 520 is shown as restricted to grooves 510, but in some embodiments the filler covers part or all of the substrate areas outside the grooves. In the embodiment of FIG. 5A, the structure is planar at this stage, and in particular the filler's top surface is coplanar with the substrate's. These features are not limiting. Further, in some embodiments, filler 520 is absent or is present but does not fill the grooves. Also, in some embodiments, perimeter groove regions 510P are filled with a different material than the remaining groove regions, and/or perimeter grooves 510P are unfilled.

Figure 6:
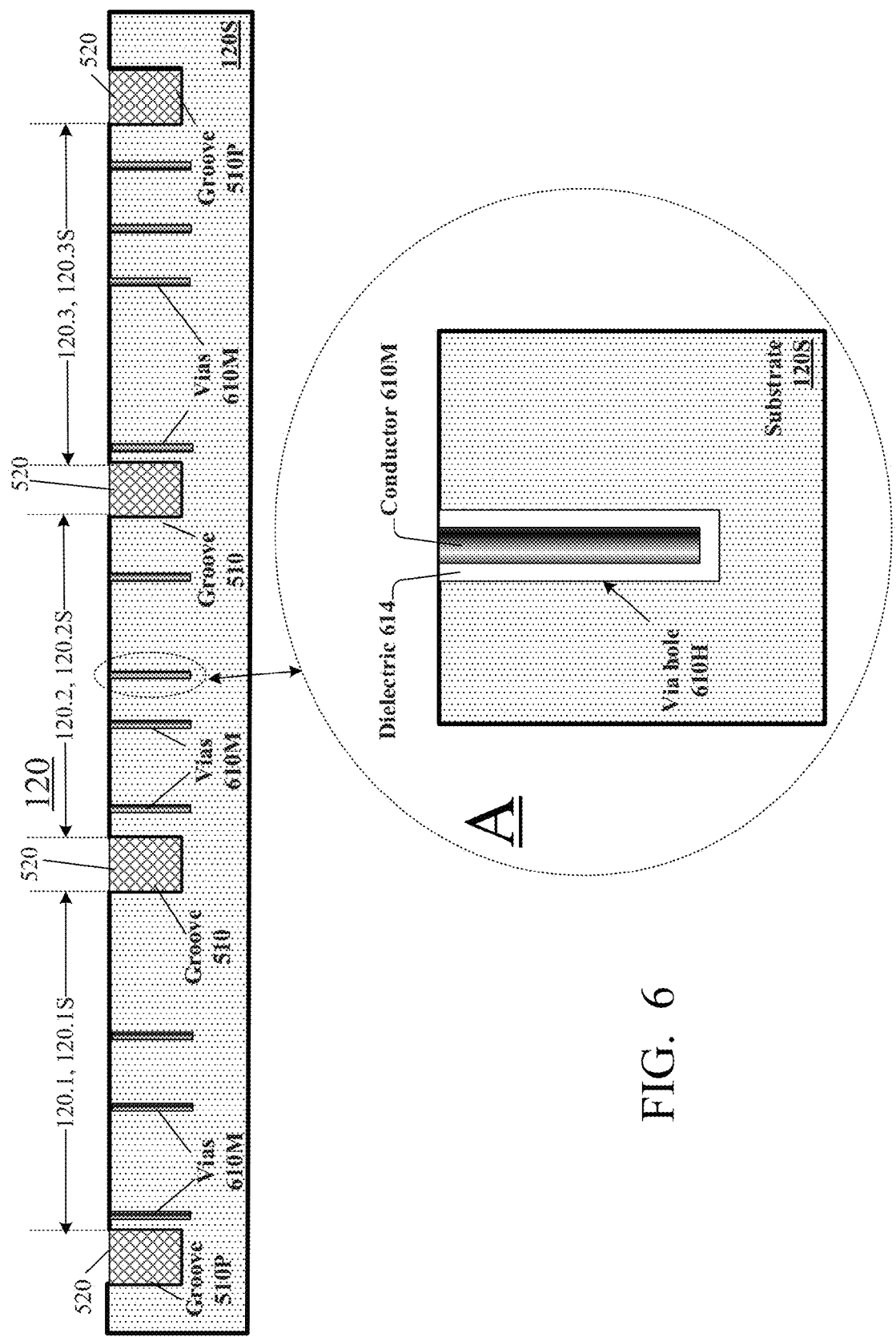
FIGS. 6, 7A illustrate vertical cross sections of interposer structures in the process of fabrication according to some embodiments of the present invention.

As shown in FIG. 6, conductive vias 610M are formed in the top surfaces of substrates 120.$i$S from metal or some other conductive material. The vias are "blind", i.e. they do not go through substrate 120S. A possible structure of via 610M is shown in insert A. The conductive vias are formed in via holes 610H. If substrate 120S is not dielectric, conductor 610M may be insulated from the substrate by a dielectric 614. A suitable process may involve etching via holes 610H, lining them with dielectric 614 if needed, then forming barrier and/or adhesion layers if needed (not shown), and then depositing conductive material 610M by electroplating or PVD or any other suitable technique. If dielectric 614 and/or the barrier layer and/or adhesion layer or and/or conductive material 610M form outside via holes 610H, some or all of such materials can be removed outside the vias (e.g. by mechanical polishing, possibly chemical-mechanical polishing (CMP), and/or etching, and/or other techniques). See e.g. U.S. Pat. No. 6,322,903 issued Nov. 27, 2001 to Siniaguine et al., incorporated herein by reference. In some embodiments, conductor 610M does not fill the holes 610H but only lines the hole surfaces, and a separate filler (not shown) may fill up the holes.

The via sidewalls do not have to be vertical, but may have any profile. In top view, each via 610M may have any shape, e.g. circular, square, elongated (trench-like), or any other shape. Different vias 610M may have different shapes and include respective different materials in the same substrate.

Vias 610M can be formed before or simultaneously with grooves 510 and material 520, possibly by the same process, possibly using the same mask to etch the grooves 510 and the holes 610H. Grooves 510 can be filled by the same materials as holes 610H or by different materials. In case of electroplating or other selective deposition for example, the same mask or different masks can be used to fill grooves 510 and via holes 610H; alternatively, some material(s) may be deposited both into grooves 510 and via holes 610H, while other material(s) may be deposited into grooves 510 but not via holes 610H and/or vice versa. Vias 610M and grooves 510 may have the same or different depths. In some embodiments, both grooves 510 and vias 610M are slightly deeper than the final thickness of substrate 120S. Use of different terms "groove" and "via hole" does not imply any structural differences between the two: the grooves and the via holes may or may not have the same structure.

Figure 7A:
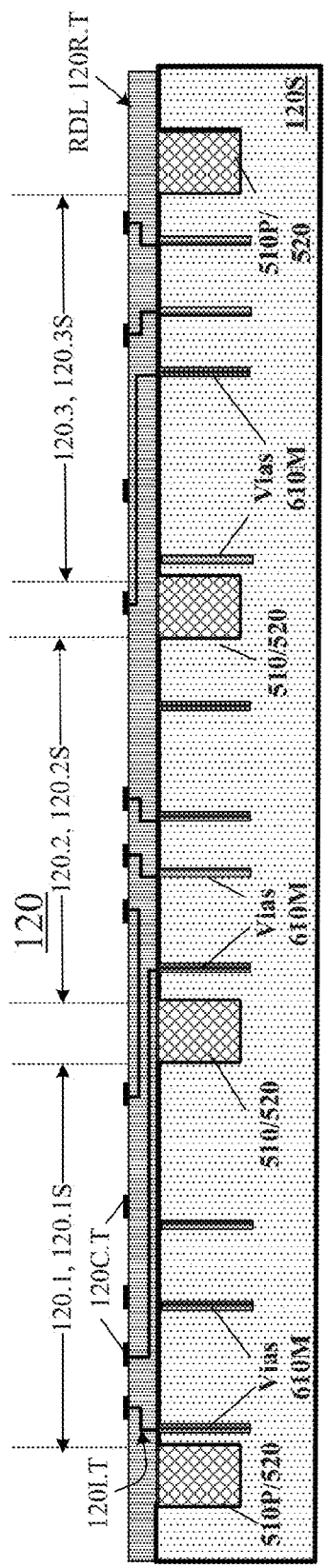
Figure 7B:
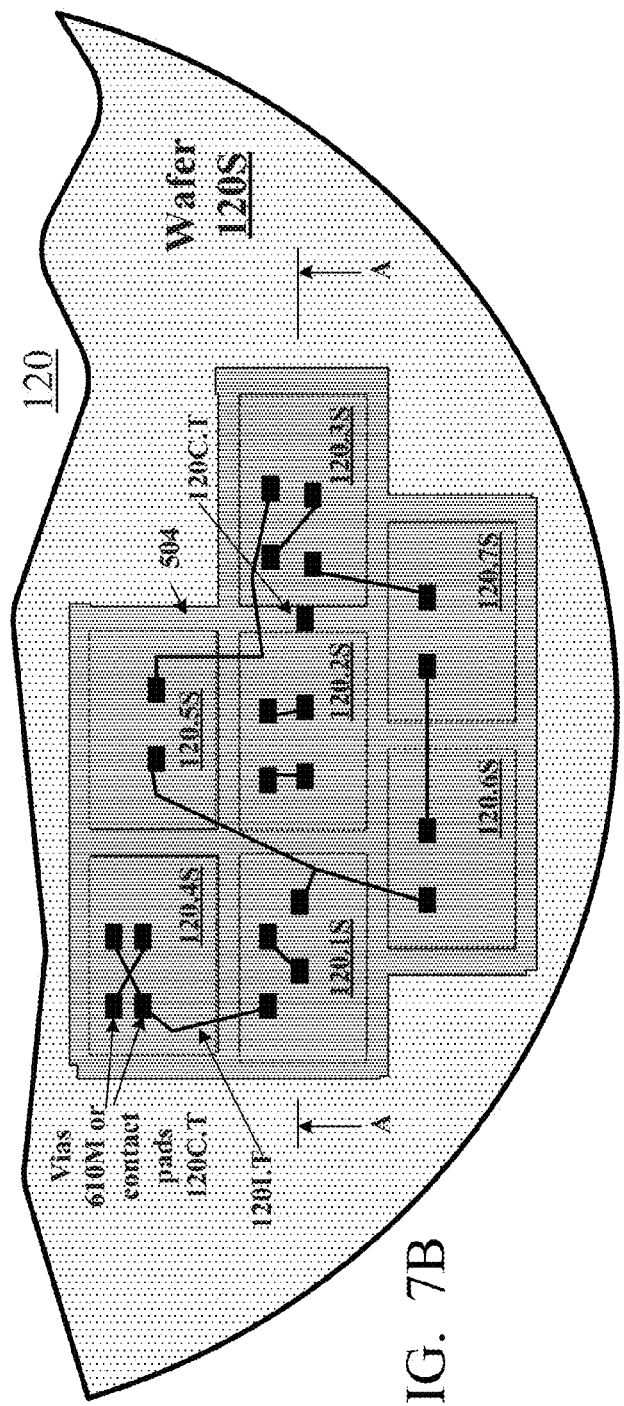
FIG. 7B illustrates a top view of an interposer structure in the process of fabrication according to some embodiments of the present invention.

As shown in FIG. 7A, a common circuit layer 120R.T (e.g. common redistribution layer) is formed on the top surface of substrate 120S by known techniques. Common RDL 120R.T provides contact pads 120C.T on top of the interposer and provides interconnects 120I.T which interconnect the contact pads and the vias 610M in a desired pattern. In some embodiments, a contact pad 120C.T or an interconnect 120I.T can be positioned anywhere on wafer 120S, not necessarily entirely over a single interposer substrate 120.$i$S. See the top view of FIG. 7B for example. An interconnect or a contact pad can overlie a groove 510, i.e. be at least partially located between individual interposer substrates 120.$i$S. An interconnect 120I.T may be connected to vias 610M and/or contact pads 120C.T located over interposer substrates 120.$i$S; the different interposers may or may not be adjacent to each other. For example, an interconnect 120I.T may interconnect vias 610M and/or contacts 120C.T in interposers 120.6 and 120.5, or in more than two adjacent and/or non-adjacent interposers. Interconnects 120I.T may include straight or non-straight line segments, and/or may be of non-line geometry (e.g. a filled circle).

Common RDL 120R.T may include non-interconnect circuits, capacitors for high band-pass filters or other purposes, and/or thin film transistors, and/or other circuit elements.

RDL 120R.T may include dielectric which insulates the interconnects 120I.T from each other and/or is used to form capacitors and other circuit elements. (The dielectric is omitted in some embodiments, e.g. if substrate 120S is itself a dielectric and the interconnects do not have to cross over each other or over other conductive or semiconductor features.) The dielectric and conductive layers forming the RDL 120R.T may optionally include one or more of layers 610M, 614 (FIG. 6), 520, or possibly other layers previously formed in interposer 120. More particularly, interposers 120.$i$ may include transistors, resistors, capacitors, and other devices (not shown) in substrate 120S and redistribution layer 120R.T. These devices can be formed before, during and/or after the fabrication of vias 610M, grooves 510/520, and RDL 120R.T using the process steps described above and/or additional process steps. Suitable fabrication techniques are well known, and other techniques can be used. See e.g. U.S. Pat. No. 6,958,285 issued Oct. 25, 2005 to Siniaguine, and US pre-grant patent publication 2012/0228778 published Sep. 13, 2012 (Kosenko et al.), both incorporated herein by reference.

Figure 8:
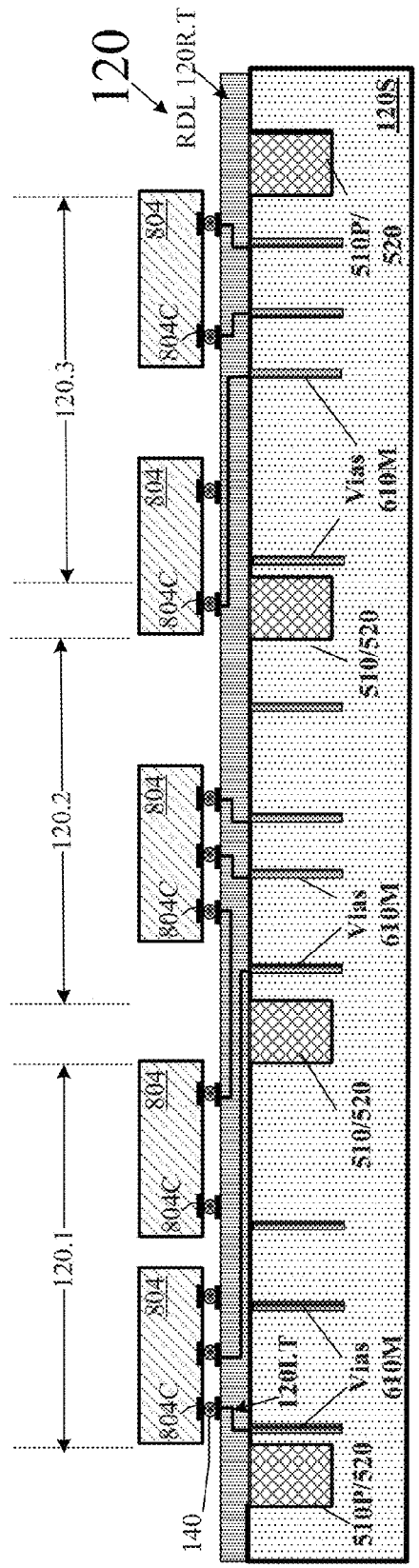

Circuit structures 804 (FIG. 8) are attached to combined interposer 120 which, at this point, includes still undiced substrate 120S and combined RDL 120R.T. Each circuit structure 804 may be an IC, e.g. a die (such as shown at 110 in FIG. 1) or a package including, for example, a stack of interconnected dies and/or one or more interposers. Each circuit structure's contact pads 804C are attached to the interposer's contact pads 120C.T. The attachments 140 may be by solder, thermocompression, conductive or anisotropic adhesive, discrete (bond) wires, or any other suitable technique, known or to be invented.

For ease of reference, we will refer to structures 804 as "packages" even though they may be unpackaged semiconductor ICs or non-semiconductor circuits (possibly discrete circuits).

Figure 9:
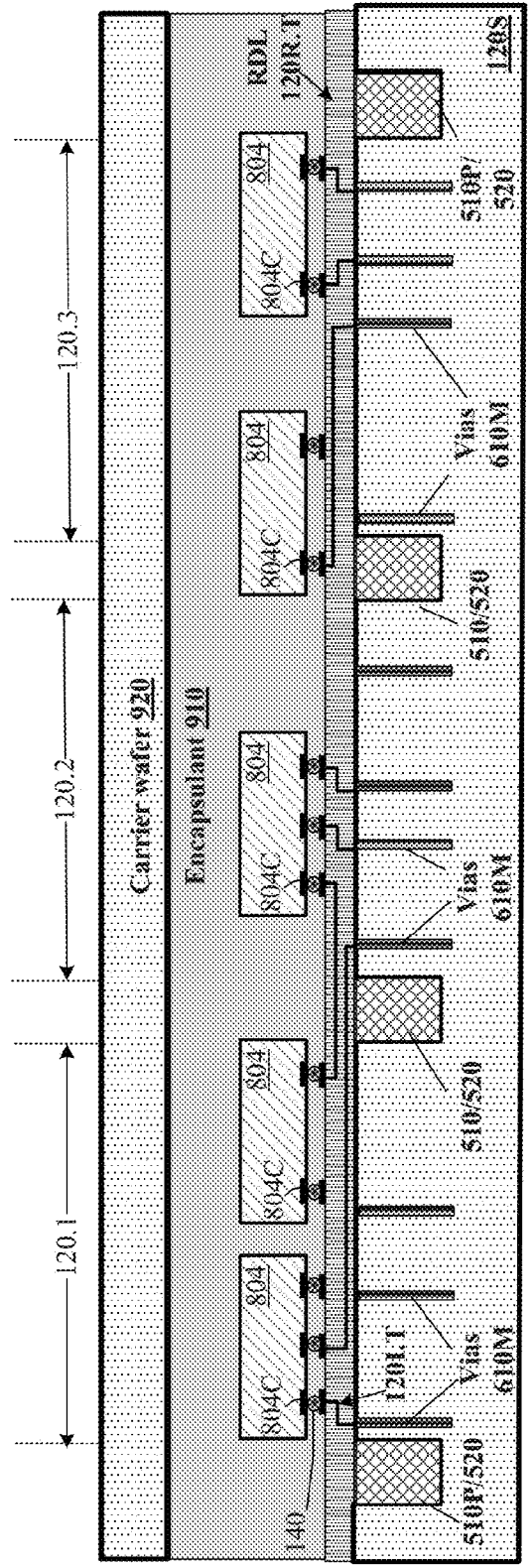

Optionally, packages 804 are underfilled and/or encapsulated by encapsulant 910 (FIG. 9), e.g. high thermal conductivity dielectric. Encapsulant 910 can be formed, for example, by depositing and then curing a flowable material, e.g. epoxy resin. Exemplary deposition methods include molding and spinning Encapsulant 910 can be de-flashed using known techniques. In FIG. 9, encapsulant 910 covers the packages 804, but in other embodiments one or more packages 804 are exposed on top and can be electrically connected to other structures such as 920.

Structure 920 is optionally attached on top to encapsulant 910 and/or packages 804, by adhesive or direct or other bonding. Structure 920 can be an IC or an IC package, or a heat sink, or a temporary carrier wafer having no circuitry and used only to improve the mechanical strength and heat dissipation for subsequent fabrication processes. Multiple structures 920 can be present. We will refer to structure 920 as "carrier wafer" for ease of reference, but this is not limiting.

Figure 10:
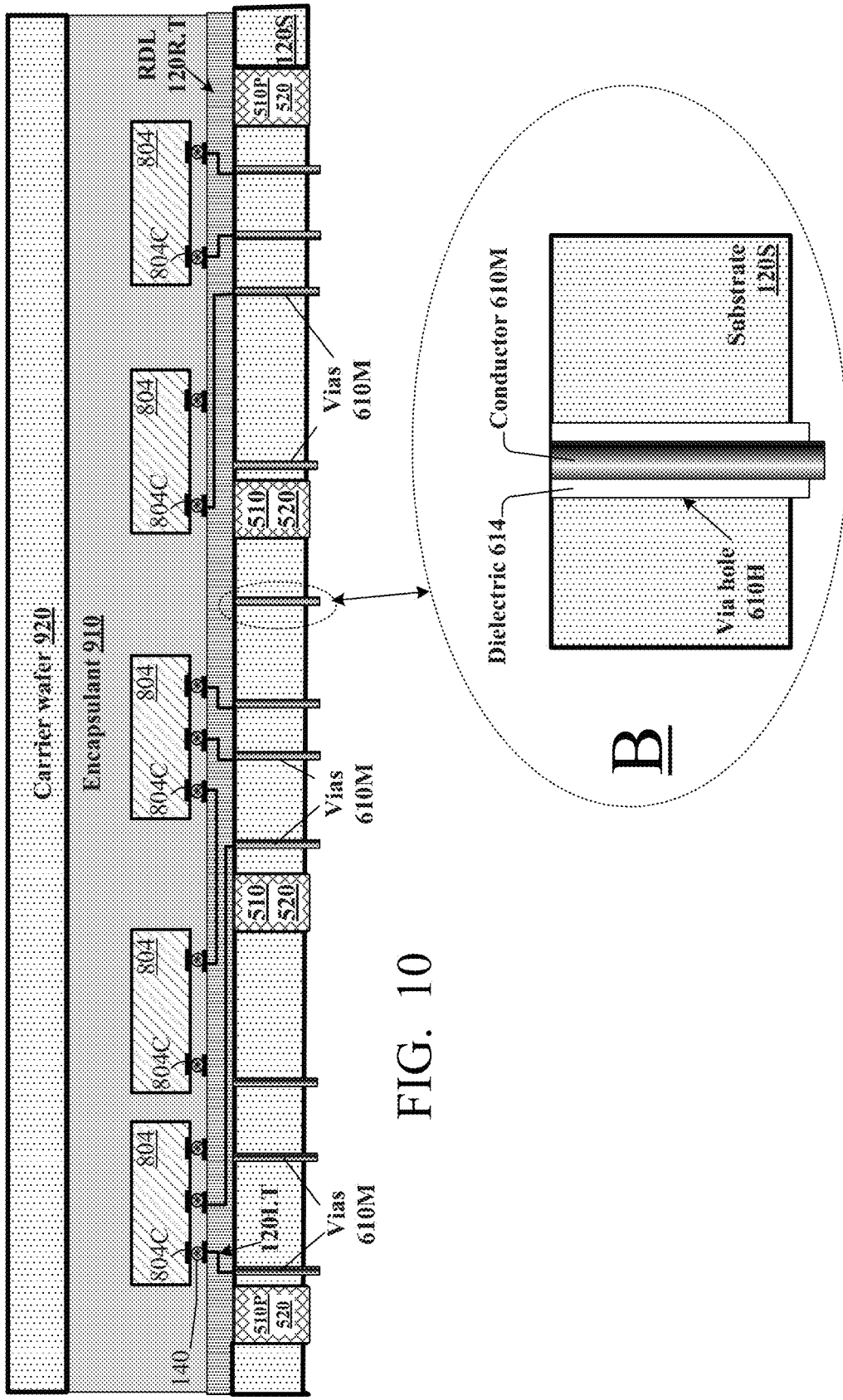

As shown in FIG. 10, the combined interposer 120 is thinned from the bottom to reveal the conductive vias 610M. The thinning can be a blanket process, e.g. mechanical grinding or lapping, or CMP, or etching, or ablation, or any other suitable process, or a combination of such process (e.g. grinding followed by CMP). The thinning process attacks the interposer substrate 120S and possibly other materials, e.g. dielectric 614 underlying the conductors 610M in holes 610H; see insert B showing a possible structure of via 610M in more detail. The thinning process turns grooves 510 into through holes, so if the grooves contain filler 520 then filler 520 becomes exposed on the bottom. Dielectric 614 and/or conductor 610M and/or filler 520 may or may not protrude on the interposer bottom. In the embodiment shown, dielectric 614 and conductor 610M protrude on the bottom, and the conductor protrudes out of the dielectric.

Some embodiments use non-blanket (masked) processes to expose the vias 610M on the bottom.

The thinning process divides the interposer substrate 120S into substrates 120.1S, 120.2S, etc. effectively forming separate interposers 120.1, 120.2, etc. interconnected by common RDL 120R.T and held together by the RDL and possibly by encapsulant 910 and carrier wafer 920. The filler 520 may or may not remain between the interposers. If the filler remains, the filler may further help to hold together the individual substrates 120.iS. The filler 520 may be coplanar with the bottom surfaces of substrates 120.iS, or may protrude down below substrates 120.iS, or may be recessed in grooves 510 (i.e. the bottom surface of filler 520 may be above the bottom surface of substrates 120.iS).

The structure's bottom surface can be processed in any desired way to enable the bottom attachment to other circuits. For example, in FIG. 11, RDL 120R.B is formed on the bottom surface from conductive and, possibly, dielectric layers to provide conductive interconnects 120I.B (including 120I.B.1) with contact pads 120C.B. Interconnects 120I.B interconnect the bottom ends of vias 610M and the contact pads 120C.B in any desired pattern, as described above for top interconnects 120I.T and top contact pads 120C.T; see e.g. FIG. 7B. In particular, contact pads 120C.B may underlie interposer substrates 120.iS and grooves 510; an interconnect 120I.B may extend between different substrates 120.iS, and may be connected to vias 610M in the same or different interposers 120.i and/or to contact pads 120C.B below the same or different interposer substrates 120.iS and/or to contact pads 120C.B at least partially present below the grooves 510.

In some embodiments, bottom contact pads 120C.B are larger, and/or at a higher pitch, than top contact pads 120C.T. The bottom contact pads can be attached to other structures (not shown), e.g. PCB(s) or interposer(s) or other dies or packages (not shown), by connections 140' which may be by solder, or thermocompression, or discrete bond wires, or other types of attachment.

Figure 11:
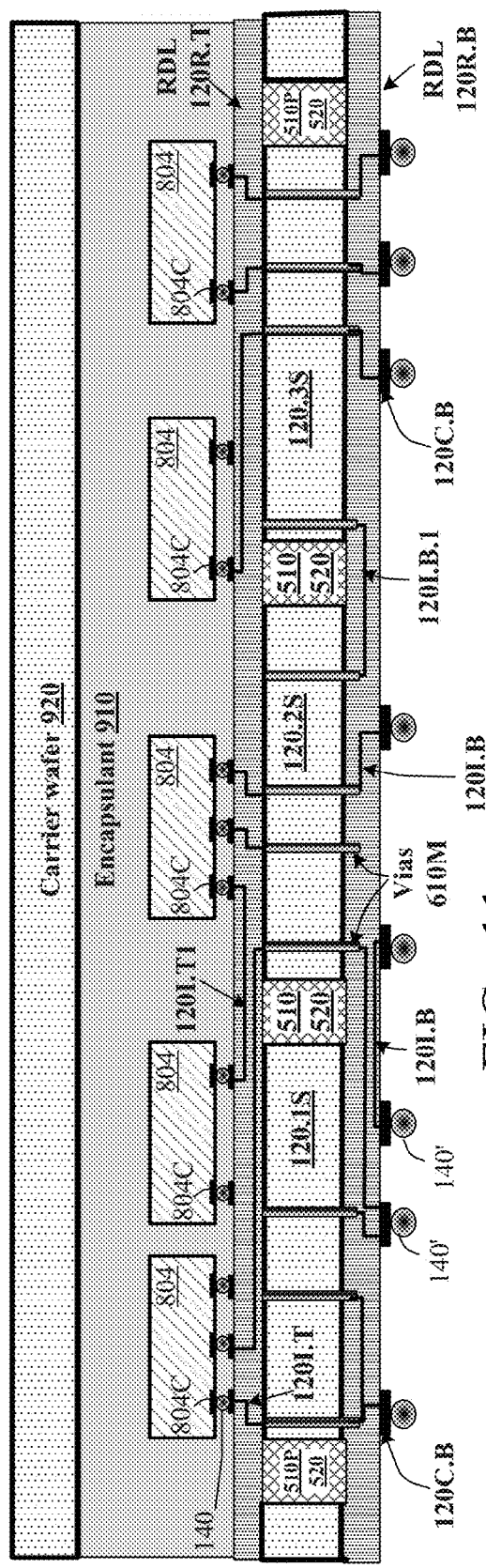

If desired, the entire package shown in FIG. 11 can be diced along the perimeter 504 (FIG. 5B). Also, if desired, carrier wafer 920 can be removed at any convenient time, before or after dicing.

Figure 12:
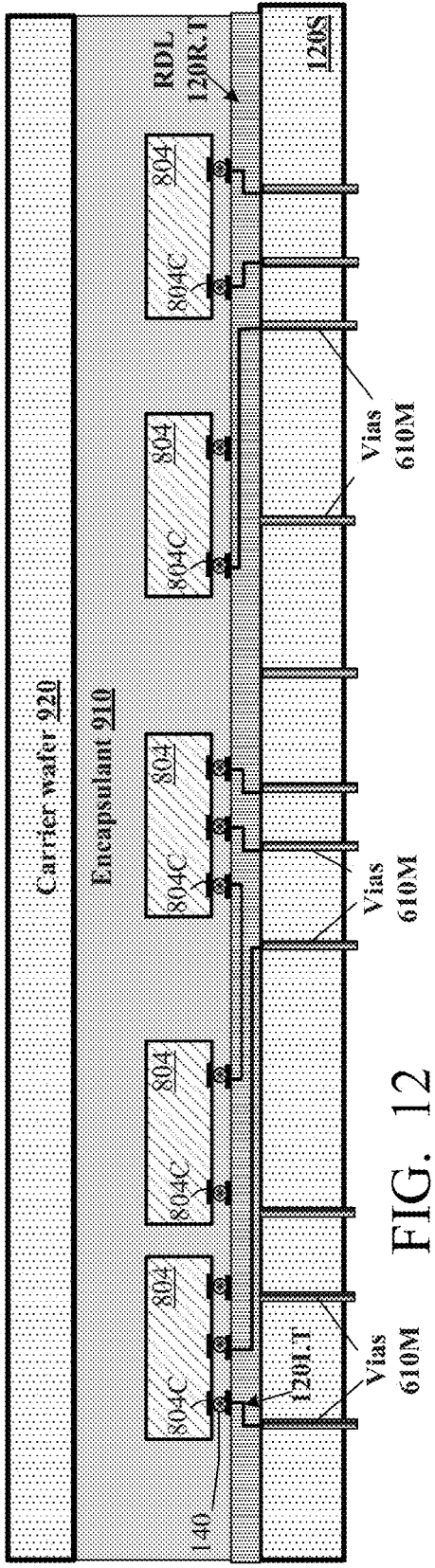

Another fabrication method is illustrated in FIG. 12: the structure of FIG. 12 is identical to the structure of FIG. 11 but grooves 510 are absent. This structure can be fabricated by any method described above by skipping the groove fabrication step of FIG. 5A. In the structure FIG. 12, grooves 510 can be formed in substrate 120S from the bottom, and can be filled with any suitable material 520, to achieve the structure of FIG. 10. The grooves 510 and filler 520 can be formed by any suitable method, including any method described above in connection with FIG. 5A. The remaining fabrication steps can be as described above in connection with FIGS. 4-11.

Figure 13:
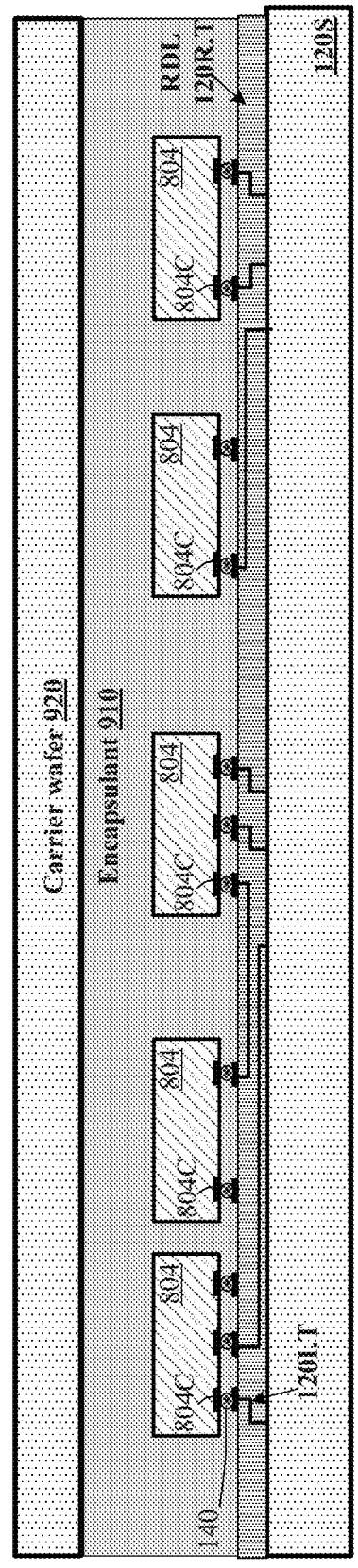

FIG. 13 is identical to FIG. 12 except that the vias 610M are absent. The substrate 120S has been thinned to a final thickness by any thinning technique described above in connection with FIG. 10. Both via holes 610H and grooves 510 can be formed in the structure of FIG. 13, i.e. after the attachment of modules 804 (and possibly after forming encapsulant 910 and attaching carrier wafer or other structure 920). The vias 610M and grooves 510/520 can be formed in any sequence, by any method described above, except that they are formed from the bottom of substrate 120S.

In another variation, the grooves 510/520 are formed from the top as in FIG. 5A, and the vias 610M from the bottom as in FIG. 13.

The invention is not limited to the embodiments described above. For example, packages 804 may overlie each other and different connections 140 may be different in the same structure, as illustrated in FIG. 14. The interposer of FIG. 14 is identical to the interposer of FIG. 11. In FIG. 14, a package 804.1 overlies and projects beyond package 804.2; package 804.2 is attached to the interposer by solder balls 140, and package 804.1 is attached to the same interposer by bond wires such as described, for example, in U.S. Pat. No. 8,618,659 issued Dec. 31, 2013 to Sato et al.

FIG. 14 also illustrates a carrier wafer 920 with cavities 1410; each cavity covers one or more packages 804; handle wafer 920 is bonded to the interposer around each cavity or at selected areas surrounding each cavity. A carrier wafer with cavities can also be used with the other features described above in connection with FIGS. 4-11. The cavity wafer portions (legs) around the packages 804 serve to increase the carrier wafer volume and thus may increase the mechanical strength and/or heat dissipation properties of the package, particularly if the material of wafer 920 is stronger and/or more thermally conductive than the encapsulant 910. The encapsulant volume can therefore be reduced (the encapsulant can be restricted to the cavities or omitted) without sacrificing the mechanical or thermal integrity. Further, the thermal stresses can be reduced if CTE matching between wafer 920 and substrate 120S is better than between encapsulant 910 and substrate 120S (for example, in some embodiments, wafer 920 is made of the same material as substrate 120S). The handle wafer with cavities can be manufactured and attached to the interposer using processes described in U.S. patent application Ser. No. 14/214,365 filed 14 Mar. 2014 by Hong Shen et al., incorporated herein by reference.

Figure 16:
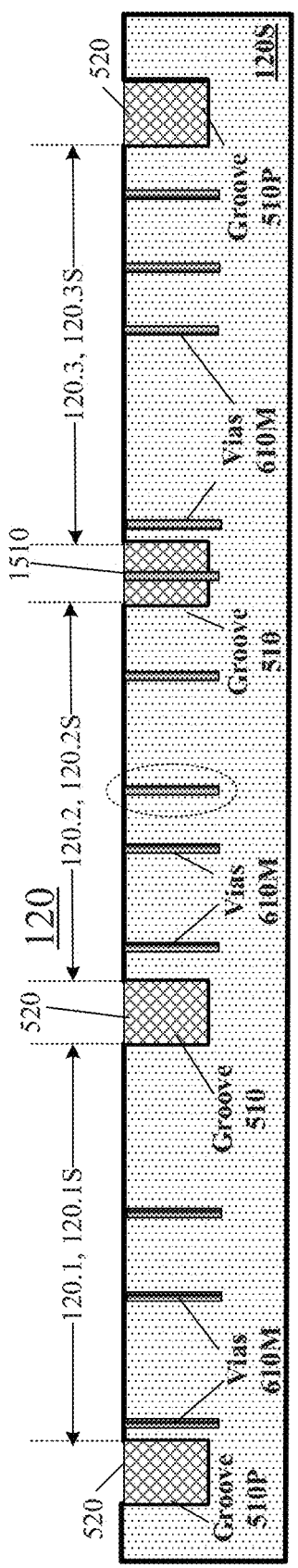

Further, as shown in FIG. 15, circuit elements above and below the interposer substrates 120.iS can be interconnected not only through vias 610M passing through the substrates but also through grooves 510. FIG. 15 shows an interconnect 1510 passing through a groove 510 and connected to a top interconnect 120I.T and a bottom interconnect 120I.B, which in turn can be connected to other circuit elements, e.g. contact pads, vias 610M, or other elements. An interconnect 1510 can also provide contact pads directly above and/or directly below a groove 510. Interconnects 1510 can be formed in any suitable way. For example, FIG. 16 shows the same fabrication stage as FIG. 6, but with an interconnect 1510 formed as a conductive via in a groove 510 (e.g. in filler 520). Such via 1510 can alternatively be formed after the top RDL 120R.T. Such vias 1510 may or may not reach the groove bottom (i.e. the substrate 120S), and may or may not go partway through the substrate 120S. Such vias 1510 can be connected to interconnects 120I.T and/or 120I.B by the same processes as described above for vias 610M.

Vias 1510 can also be formed from the bottom of the interposer, possibly after attachment of packages 804, as described above for vias 610M in connection with FIGS. 12 and 13.

Figure 17:
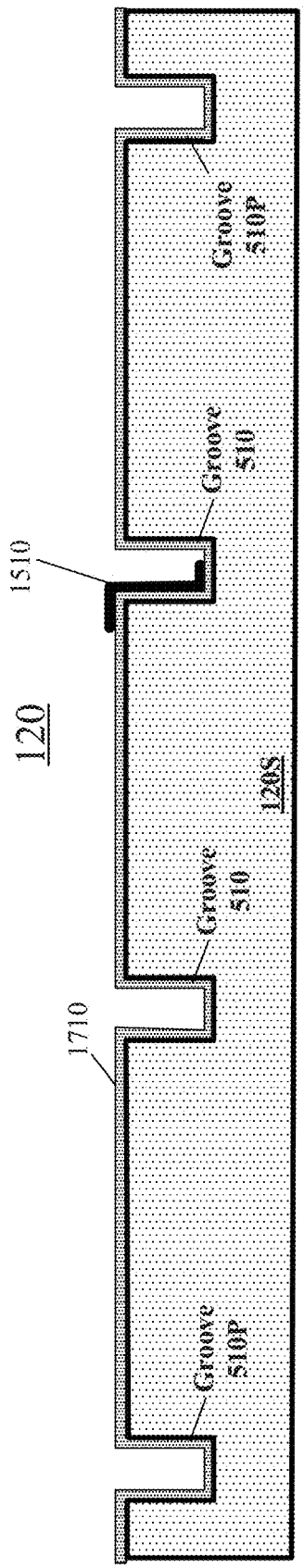

Another possible process is illustrated in FIG. 17: interconnects 1510 are formed after forming the grooves 510, possibly before forming the filler 520 (filler 520 can be absent). A dielectric 1710 insulates the interconnects 1510 from substrate 120S if substrate 120S is not dielectric; dielectric 1710 can be formed after grooves 510 before interconnects 1510. Subsequent fabrication steps can be as described above; in particular, the interconnects 1510 can be exposed on the bottom as described above in connection with FIG. 10; if dielectric 1710 is present, the dielectric may have to be removed at the groove bottom to expose the interconnect. (Alternatively, dielectric 1710 may be removed from the groove bottom from the top of the interposer before the interconnect layer 1510 is formed.)

Grooves 510 can include non-interconnect circuits. For example, a groove may include a capacitor with both electrodes in the groove, or with one or both of the electrodes being provided by the groove's surface, or other types of capacitors. Or a groove may include a transistor or a transistor's portion (e.g. a MOS transistor's gate), or other circuit elements. The circuit elements in the groove may be connected to circuit elements above and/or below the interposer substrates, e.g. to interconnects 120I.T and 120I.B.

An interposer can be any interconnection substrate, with any size contact pads, not necessarily larger contact pads on the bottom than on the top as in FIG. 1. A contact pad is any conductive feature available for attachment to another circuit element; for example, a contact pad can be a conductive line; a conductive line can also be considered as multiple contact pads if multiple attachments can be made to the line.

Some embodiments provide a circuit assembly comprising:

a combined interposer (e.g. 120) comprising a plurality of constituent interposers (e.g. 120.i), each constituent interposer comprising a substrate (e.g. 120.iS), the substrates being laterally spaced from each other;

wherein the combined interposer comprises a first circuit layer comprising circuitry and physically contacting a top surface of one or more of the substrates. For example, the first circuit layer can be RDL 120R.T, and may comprise continuous conductive lines, capacitors, thin film transistors, and other desired devices. In some embodiments, the first circuit layer is formed entirely of thin films.

Further, for each of one or more of the constituent interposers, the constituent interposer comprises a first constituent circuit layer (e.g. portion of RDL 120R.T overlying the constituent interposer's substrate 120.iS) which is part of the first circuit layer, the first constituent circuit layer being present on a top surface of the constituent interposer's substrate, the first constituent circuit layer comprising circuitry;

wherein the first circuit layer comprises each first constituent circuit layer, and continuously extends from at least one first constituent circuit layer laterally beyond the corresponding substrate;

wherein the first circuit layer comprises first contact pads on top (e.g. 120C.T);

wherein the circuit assembly further comprises one or more circuit modules (e.g. 804) at least one of which comprises an integrated circuit, the one or more circuit modules overlying the first circuit layer, each circuit module comprising one or more contact pads attached to one or more first contact pads.

In some embodiments, at least a portion of at least one first contact pad overlies a gap (e.g. 510) separating at least two of the adjacent substrates from each other.

In some embodiments, the first circuit layer comprises a circuit extending over different substrates.

In some embodiments, the first circuit layer comprises a circuit connected to first contact pads which are not located over any single one of the substrates. One example of such a circuit is a continuous conductive line 120I.T1 in FIG. 11.

In some embodiments, the combined interposer comprises a second circuit layer (e.g. bottom RDL 120R.B) comprising circuitry and physically contacting a bottom surface of one or more of the substrates;

wherein for each of one or more of the constituent interposers, the constituent interposer comprises a second constituent circuit layer (part of RDL 120R.B under a single substrate 120.iS) which is part of the second circuit layer, the second constituent circuit layer being present on a bottom surface of the constituent interposer's substrate, the second constituent circuit layer comprising circuitry;

wherein the second circuit layer comprises each second constituent circuit layer;

wherein the second circuit layer comprises second contact pads on the bottom (e.g. 120C.B);

wherein one or more of the constituent interposers each comprise one or more conductive through-paths (e.g. 610M) passing through the constituent interposers' substrates, each conductive through-path being connected to at least one first constituent circuit layer and at least one second constituent circuit layer.

Further, in some embodiments, the second circuit layer continuously extends from at least second constituent circuit layer laterally beyond the corresponding substrate.

Further, in some embodiments, at least a portion of at least one second contact pad underlies a gap separating at least two of the adjacent substrates from each other.

Further, in some embodiments, the second circuit layer comprises a circuit extending under different substrates.

Further, in some embodiments, at least one of the first and second circuit layers comprises a circuit connected to conductive through-paths of different constituent interposers. An example of such a circuit is a continuous conductive line 120I.B.1 in FIG. 11. Such circuits may exist both at the top and bottom of the interposer.

Further, in some embodiments, all the substrates are formed of the same material or materials, and a gap separating the substrates from each other comprises a material (e.g. 520) having a higher CTE and/or lower elasticity modulus and/or lower stiffness than each of the substrates.

Some embodiments provide method for manufacturing a circuit assembly, the method comprising:

forming a groove pattern (e.g. 510) comprising one or more grooves in a top surface of a substrate (e.g. 120S), the groove pattern separating a plurality of substrate regions (e.g. 120.iS) from each other, the substrate regions being joined together by the substrate's bottom portion underlying the groove pattern;

forming a first circuit layer (e.g. RDL 120R.T) overlying the substrate regions and the groove pattern, the first circuit layer comprising circuitry with first contact pads (e.g. 120C.T) on top, the circuitry overlapping the groove pattern;

attaching one or more circuit modules (e.g. 804) to the first contact pads; and removing at least part of the substrate's bottom portion underlying the groove pattern so that the substrate regions are no longer joined together by the substrate.

In some embodiments, the method further comprises, before removing at least part of the substrate's bottom portion, forming in the groove pattern a material (e.g. 520) having a higher CTE and/or lower elasticity modulus and/or lower stiffness than each of the substrate regions.

In some embodiments, the method further comprises:

after removing at least part of the substrate's bottom portion, forming a second circuit layer (e.g. RDL 120R.B) underlying the substrate regions and the groove pattern, the second circuit layer comprising circuitry with second contact pads (e.g. 120C.B) on the bottom, the circuitry overlapping the groove pattern;

forming one or more conductive through-paths (e.g. 610M) passing through one or more of the substrate regions, each conductive through-path being connected to the first and second circuit layers.

Some embodiments provide a method for manufacturing a circuit assembly, the method comprising:

forming a first circuit layer (e.g. 120R.T) overlying a substrate, the first circuit layer comprising circuitry with first contact pads on top;

attaching one or more circuit modules (e.g. 804) to the first contact pads; and then removing material from the substrate's bottom (e.g. as in FIG. 12 or 13) to obtain from the substrate a plurality of substrate regions (e.g. 120.$i$S) spaced from each other and not joined together by the substrate, and to form a gap pattern comprising one or more gaps separating the substrate regions from each other, the first circuit layer not being removed, the circuitry overlapping at least one of the substrate regions and the gap pattern.

In some embodiments, the method further comprises, after removing material from the substrate's bottom, forming in the gap pattern a material having a higher CTE and/or lower elasticity modulus and/or lower stiffness than each of the substrate regions.

In some embodiments, the method further comprises:

forming a second circuit layer underlying the substrate regions and the gap pattern, the second circuit layer comprising circuitry with second contact pads on the bottom, the circuitry overlapping the gap pattern;

forming one or more conductive through-paths passing through one or more of the substrate regions, each conductive through-path being connected to the first and second circuit layers.

The invention is not limited to the embodiments described above. Other embodiments and variations are within the scope of the invention, as defined by the appended claims.

The invention claimed is:

1. A circuit assembly comprising:

a combined interposer comprising a plurality of constituent interposers, each constituent interposer comprising a substrate, the substrates being laterally spaced from each other;

wherein the combined interposer comprises a first circuit layer comprising a circuitry and physically contacting a top surface of two or more of the substrates, the circuitry comprising a circuit extending over at least two of said two or more of the substrates;

wherein for each of two or more of the constituent interposers, the constituent interposer comprises a first constituent circuit layer which is part of the first circuit layer, the first constituent circuit layer being present on a top surface of the constituent interposer's substrate, the first constituent circuit layer comprising circuitry;

wherein the first circuit layer comprises first contact pads on top;

wherein the circuit assembly further comprises one or more circuit modules at least one of which comprises an integrated circuit, the one or more circuit modules overlying the first circuit layer, each circuit module comprising one or more contact pads attached to one or more first contact pads;

wherein at least a portion of at least one first contact pad overlies a gap separating at least two of the adjacent substrates from each other.

2. The circuit assembly of claim 1 wherein the first circuit layer comprises a circuit connected to first contact pads located over different ones of the substrates.

3. The circuit assembly of claim 1 wherein the gap separating the substrates from each other has a higher CTE and/or lower elasticity modulus and/or lower stiffness than each of the substrates.

4. The circuit assembly of claim 1 wherein the substrates are inorganic, and are joined together by a material comprising an organic polymer.

5. A circuit assembly comprising:

a combined interposer comprising a plurality of constituent interposers, each constituent interposer comprising a substrate, the substrates being laterally spaced from each other;

wherein the combined interposer comprises a first circuit layer comprising a circuitry and physically contacting a top surface of two or more of the substrates, the circuitry comprising a circuit extending over at least two of said two or more of the substrates;

wherein for each of two or more of the constituent interposers, the constituent interposer comprises a first constituent circuit layer which is part of the first circuit layer, the first constituent circuit layer being present on a top surface of the constituent interposer's substrate, the first constituent circuit layer comprising circuitry;

wherein the first circuit layer comprises first contact pads on top;

wherein the circuit assembly further comprises one or more circuit modules at least one of which comprises an integrated circuit, the one or more circuit modules overlying the first circuit layer, each circuit module comprising one or more contact pads attached to one or more first contact pads;

wherein the combined interposer comprises a second circuit layer comprising circuitry and physically contacting a bottom surface of one or more of the substrates;

wherein for each of one or more of the constituent interposers, the constituent interposer comprises a second constituent circuit layer which is part of the second circuit layer, the second constituent circuit layer being present on a bottom surface of the constituent interposer's substrate, the second constituent circuit layer comprising circuitry;

wherein the second circuit layer comprises each second constituent circuit layer;

wherein the second circuit layer comprises second contact pads on the bottom;

wherein one or more of the constituent interposers each comprise one or more conductive through-paths passing through the constituent interposers' substrates, each conductive through-path being connected to at least one first constituent circuit layer and at least one second constituent circuit layer.

6. The circuit assembly of claim 5 wherein at least a portion of at least one second contact pad underlies a gap separating at least two of the adjacent substrates from each other.

7. The circuit assembly of claim 5 wherein the second circuit layer comprises a circuit extending under different substrates.

8. The circuit assembly of claim 7 wherein at least one of the first and second circuit layers comprises a circuit connected to conductive through-paths of different constituent interposers.

9. A circuit assembly comprising:
a combined interposer comprising a plurality of constituent interposers, each constituent interposer comprising a substrate, the substrates being laterally spaced from each other;
wherein the combined interposer comprises a first circuit layer comprising a circuitry and physically contacting a top surface of one or more of the substrates;
wherein for each of one or more of the constituent interposers, the constituent interposer comprises a first constituent circuit layer which is part of the first circuit layer, the first constituent circuit layer being present on a top surface of the constituent interposer's substrate, the first constituent circuit layer comprising circuitry;
wherein the first circuit layer comprises each first constituent circuit layer, and continuously extends from at least one first constituent circuit layer laterally beyond the corresponding substrate;
wherein the first circuit layer comprises first contact pads on top;
wherein the circuit assembly further comprises a plurality of circuit modules each of which comprises an integrated circuit, the plurality of circuit modules overlying the first circuit layer, each circuit module comprising one or more contact pads attached to one or more first contact pads, the first circuit layer comprising a circuit interconnecting at least two first contact pads attached to contact pads of different ones of said circuit modules;
wherein at least one said circuit module comprises a plurality of said contact pads which are attached to first contact pads which are not located over any single one of the substrates.

10. The circuit assembly of claim 9 wherein the substrates are inorganic, and are joined together by a material comprising an organic polymer.

11. A circuit assembly comprising:
a combined interposer comprising a plurality of constituent interposers, each constituent interposer comprising a substrate, the substrates being laterally spaced from each other;
wherein the combined interposer comprises a first circuit layer comprising a circuitry and physically contacting a top surface of one or more of the substrates;
wherein for each of one or more of the constituent interposers, the constituent interposer comprises a first constituent circuit layer which is part of the first circuit layer, the first constituent circuit layer being present on a top surface of the constituent interposer's substrate, the first constituent circuit layer comprising circuitry;
wherein the first circuit layer comprises each first constituent circuit layer, and continuously extends from at least one first constituent circuit layer laterally beyond the corresponding substrate;
wherein the first circuit layer comprises first contact pads on top;
wherein the circuit assembly further comprises one or more circuit modules at least one of which comprises an integrated circuit, the one or more circuit modules overlying the first circuit layer, each circuit module comprising one or more contact pads attached to one or more first contact pads;
wherein the combined interposer comprises a second circuit layer comprising circuitry and physically contacting a bottom surface of one or more of the substrates;
wherein for each of one or more of the constituent interposers, the constituent interposer comprises a second constituent circuit layer which is part of the second circuit layer, the second constituent circuit layer being present on a bottom surface of the constituent interposer's substrate, the second constituent circuit layer comprising circuitry;
wherein the second circuit layer comprises each second constituent circuit layer;
wherein the second circuit layer comprises second contact pads on the bottom;
wherein one or more of the constituent interposers each comprise one or more conductive through-paths passing through the constituent interposers' substrates, each conductive through-path being connected to at least one first constituent circuit layer and at least one second constituent circuit layer.

12. The circuit assembly of claim 11 further comprising a circuit element passing between at least two of the substrates, for connecting a contact pad or other circuit element above the substrates to a contact pad or other circuit element below the substrates.

13. A circuit assembly comprising a combined interposer comprising:
a plurality of inorganic substrates, the inorganic substrates laterally spaced from each other and being separated from each other by a gap pattern comprising organic polymeric material joining together the inorganic substrates;
a plurality of first contact pads at a top of the combined interposer and a plurality of second contact pads at a bottom of the combined interposer, the first and second contact pads being attachable to circuit elements outside of the combined interposer;
one or more circuits each of which interconnects one or more first contact pads and one or more second contact pads, at least one said circuit passing through the organic polymeric material in the gap pattern between a region above the inorganic substrates and a region below the inorganic substrates.

14. The circuit assembly of claim 13 wherein at least one said circuit passes through one of said inorganic substrates.

15. A circuit assembly comprising:
a combined interposer comprising a plurality of constituent interposers, each constituent interposer comprising a substrate, the substrates being laterally spaced from each other;
wherein the combined interposer comprises a first circuit layer comprising a circuitry and physically contacting a top surface of two or more of the substrates, the circuitry comprising a circuit extending over at least two of said two or more of the substrates;
wherein for each of two or more of the constituent interposers, the constituent interposer comprises a first constituent circuit layer which is part of the first circuit layer, the first constituent circuit layer being present on a top surface of the constituent interposer's substrate, the first constituent circuit layer comprising circuitry;
wherein the first circuit layer comprises first contact pads on top;

wherein the combined interposer further comprises second contact pads on the bottom, and comprises one or more circuits each of which passes through a gap between adjacent ones of the substrates from a region above the substrates to a region below the substrates and is connected to one or more first contact pads and to one or more second contact pads.

16. The circuit assembly of claim 15 wherein the substrates are inorganic, and are joined together by a material comprising an organic polymer.

* * * * *